US005324896A

United States Patent [19]

Magnani

[11] Patent Number: 5,324,896

[45] Date of Patent: Jun. 28, 1994

[54] AUDIO LOUDSPEAKER SYSTEM

[76] Inventor: Joseph Magnani, 76 Essex St., North Babylon, N.Y. 11704

[21] Appl. No.: 47,682

[22] Filed: Apr. 12, 1993

[51] Int. Cl.5 .................... H05K 5/00

[52] U.S. Cl. .................... 181/144; 181/146; 181/147; 181/151; 181/156

[58] Field of Search .................... 181/144, 145, 146, 147, 181/148, 151, 156, 199

[56] References Cited

U.S. PATENT DOCUMENTS

| | | | |
|---|---|---|---|
| 3,165,587 | 1/1965 | Alderson | 181/144 X |
| 3,952,159 | 4/1976 | Schott | 181/156 |
| 4,224,469 | 9/1980 | Karson | 181/144 X |
| 4,349,084 | 9/1982 | Karpodines | 181/156 X |
| 4,413,703 | 11/1983 | Kato et al. | 181/156 |
| 4,624,338 | 11/1986 | Ewald | 181/148 |
| 4,884,655 | 12/1989 | Freadman et al. | 181/147 X |

*Primary Examiner*—Michael L. Gellner
*Assistant Examiner*—Khanh Dang
*Attorney, Agent, or Firm*—Richard L. Miller

[57] ABSTRACT

An audio loudspeaker system is provided which consists of an enclosure having a front wall, a rear wall with a plurality of circular openings, a pair of side wall, a top wall and a bottom wall. A plurality of loudspeaker components are supported on the front wall of the enclosure for radiating sound energy therethrough and having varying frequency ranges. A plurality of tubular ducts are supported in the circular openings in the rear wall and extend inwardly into the enclosure to exhibit a tuned acoustic frequency to the loudspeaker components having the lowest frequency ranges.

4 Claims, 1 Drawing Sheet

AUDIO LOUDSPEAKER SYSTEM

BACKGROUND OF THE INVENTION

The instant invention relates generally to sound reproducing units and more specifically it relates to an audio loudspeaker system.

Numerous sound reproducing units have been provided in the prior art that have attempted to improve the fidelity of sound for the reproduction of recordings, broadcasts and live entertainment. For example, U.S. Pat. Nos. 3,952,159 to Schott; 4,266,092 to Barker III and 4,410,063 to Yasue et al. all are illustrative of such prior art. While these units may be suitable for the particular purpose to which they address, they would not be as suitable for the purpose of the present invention as hereafter described.

SUMMARY OF THE INVENTION

A primary object of the present invention is to provide an audio loudspeaker system that will overcome the shortcomings of the prior art devices.

Another object is to provide an audio loudspeaker system that will offer outstanding bass, incredibly defined instrumental, percussion and vocal sound which ultimately produces superior stereo separation.

An additional object is to provide an audio loudspeaker system in which an enclosure with various components having quality features will enable them to reproduce life like sound magnitude.

A further object is to provide an audio loud speaker system that is simple and easy to use.

A still further object is to provide an audio loudspeaker system that is economical in cost to manufacture.

Further objects of the invention will appear as the description proceeds.

To the accomplishment of the above and related objects, this invention may be embodied in the form illustrated in the accompanying drawings, attention being called to the fact, however, that the drawings are illustrative only and that changes may be made in the specific construction illustrated and described within the scope of the appended claims.

BRIEF DESCRIPTION OF THE DRAWING FIGURES

The figures in the drawings are briefly described as follows.

DETAILED DESCRIPTION OF THE PREFERRED EMBODIMENTS

Figure 1:
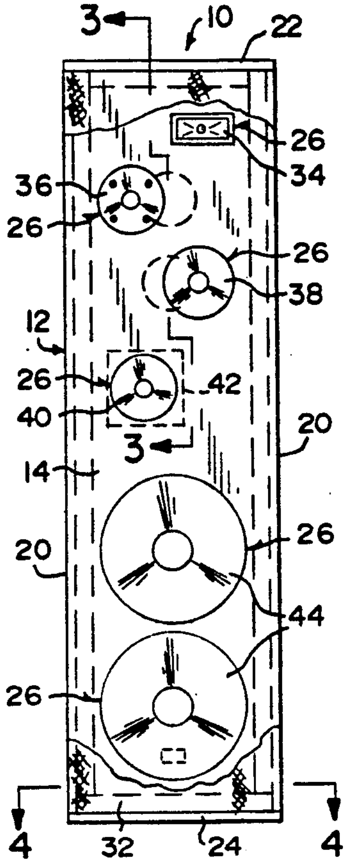
FIG. 1 is a diagrammatic front elevational view of the instant invention.
Figure 3:
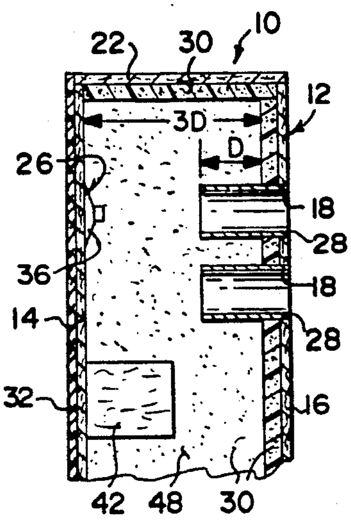
FIG. 3 is a cross sectional view with parts broken away taken on line 3—3 of FIG. 1.
Figure 2:
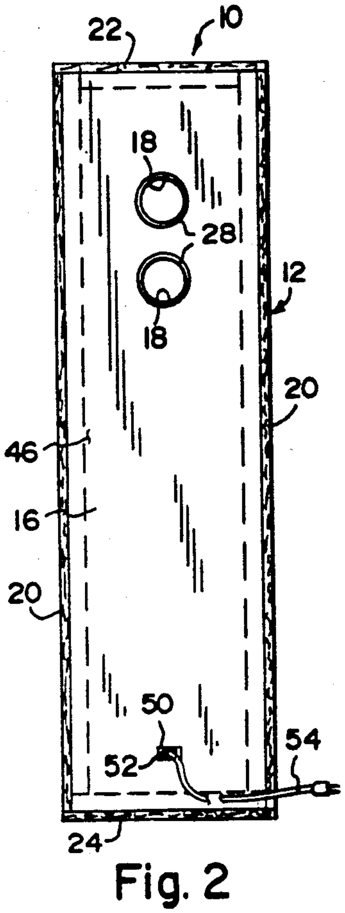
FIG. 2 is a rear elevational view thereof.
Figure 4:
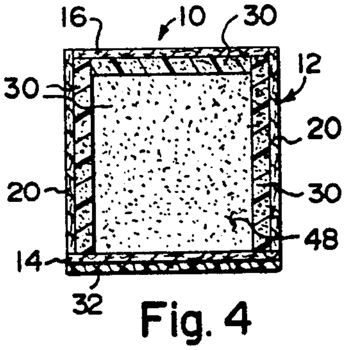
FIG. 4 is a cross sectional view taken on line 4—4 of FIG. 1.
Figure 5:
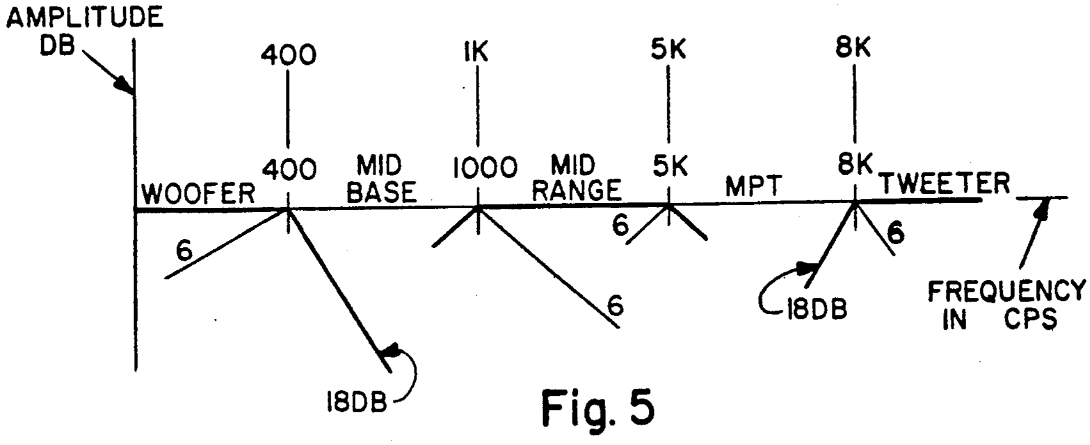
FIG. 5 is a Bode diagram amplitude plot illustrating the frequency characteristics of the instant invention.

Turning now descriptively to the drawings, in which same reference characters denote elements throughout the several views, the Figures illustrate an audio loudspeaker system 10 which consists of an enclosure 12 having a front wall 14, a rear wall 18, a pair of side walls 20, a top wall 22 and a bottom wall 24. A plurality of loudspeaker components 26 are supported on the front wall 14 of the enclosure 12 for radiating sound energy therethrough and having varying frequency ranges. A plurality of tubular ducts 28 are supported in the circular opening 18 in the rear wall 16 and extends inwardly into the enclosure 12 to exhibit a tuned acoustic frequency to the loudspeaker components 26 having the lowest frequency ranges.

In the particular example illustrated the tubular ducts are approximately 3 inches in diameter and extend approximately 4 inches from the internal foam insulation surface of the rear of the speaker enclosure cavity which has dimensions that are approximately 56 inches high, 12 inches deep i.e. that is frôm front to back internal surfaces and 12 inches wide i.e. that is from left to right internal surfaces. Both ducts are centered on the centerline of the rear wall 16 and located generally behind the higher frequency speaker components of the system and away from the lower speaker components.

The enclosure 12 includes insulation 30 secured against an interior surface of the rear wall 16, the side walls 20, the top wall 22, and the bottom wall 24. A decorative grill 32 is secured against an exterior surface of the front wall 14.

The loudspeaker components 26 include a piezoelectric super tweeter 34, having a frequency range above 8 kHz, polyethylene terephthalate polyester film sold under the trademark MYLAR dome tweeter 36, having a frequency range between 5 kHz and 8 kHz, a polypropylene mid range 38, having a frequency range between 1 kHz and 5 kHz. A polypropylene mid bass 40 being internally boxed at 42 and having a frequency range between 400 Hz and 1 kHz and two woofers 44, each having a frequency range below 400 Hz.

The front wall 14, the rear wall 16, the side walls 20, the top wall 22 and the bottom wall 24 of the enclosure 12 are fabricated out of plywood, particle board and similar materials 46. The insulation 30 is fabricated out of foam rubber, fiberglass batting and similar materials 48.

The audio loudspeaker system 10 further includes a quick connect terminal 50 located in the rear wall 16 of the enclosure 12, to receive a plug 52 on a cord 54 from an audio amplification unit (not shown).

While certain novel features of this invention have been shown and described and are pointed out in the annexed claims, it will be understood that various omissions, substitutions and changes in the forms and details of the device illustrated and in its operation can be made by those skilled in the art without departing from the spirit of the invention.

What is claimed is:

1. An audio loudspeaker system, which comprises:

a) an enclosure having a front wall, a rear wall with a plurality of circular openings, a pair of side walls, a top wall and a bottom wall;

b) a plurality of loudspeaker components supported on said front wall of said enclosure for radiating sound energy therethrough and which include at least one speaker having a high frequency range, at least one speaker having a low frequency range, wherein said loudspeaker components include:

i) a piezoelectric super tweeter having a frequency range above 8 kHz;

ii) a MYLAR dome tweeter having a frequency range between 5 kHz and 8 kHz;

iii) a polypropylene mid range speaker having a frequency range between 1 kHz and 5 kHz;

iv) a polypropylene mid bass speaker being internally boxed and having a frequency range between 400 Hz and 1 kHz; and v) two woofers, each having a frequency range below 400 Hz; and c) a plurality of tubular ducts supported in said circular openings in said rear wall and extending inwardly into said enclosure to exhibit a tuned acoustic frequency to said loudspeaker component having a lowest frequency range, wherein a depth of the enclosure is approximately three times a depth that said plurality of tubular ducts into said enclosure, wherein said plurality of tubular ducts are located in said enclosure in an area which is far from said low frequency speaker components, wherein said enclosure includes:

i) insulation secured, against an interior surface of said rear wall, said side walls, said top wall and said bottom wall; and ii) a decorative grill secured against an exterior surface of said front wall.

2. An audio loudspeaker system as recited in claim 1, further including:

a) said front wall, said rear wall, said side walls, said top wall and said bottom wall of said enclosure fabricated out of plywood or particle board; and b) said insulation fabricated out of foam rubber or fiberglass batting.

3. An audio loudspeaker system, which comprises:

a) an enclosure having a front wall, a rear wall with a plurality of circular openings, a pair of side walls, a top wall and a bottom wall;

b) a plurality of loudspeaker components supported on said front wall of said enclosure for radiating sound energy therethrough and which include at least one speaker having a high frequency range, at least one speaker having a low frequency range, wherein said loudspeaker components include:

i) a piezoelectric super tweeter having a frequency range about 8 kHz;

ii) a MYLAR dome tweeter having a frequency range between 5 kHz and 8 kHz;

iii) a polypropylene mid range speaker having a frequency range between 1 kHz and 5 kHz;

iv) a polypropylene mid bass speaker being internally boxed and having a frequency range between 400 Hz and 1 kHz; and v) two woofers, each having a frequency range below 400 Hz; and c) a plurality of tubular ducts supported in said circular openings in said rear wall and extending inwardly into said enclosure to exhibit a tuned acoustic frequency to said loudspeaker component having a lowest frequency range, wherein a depth of the enclosure is approximately three times a depth that said plurality of tubular ducts into said enclosure, wherein said plurality of tubular ducts are located in said enclosure in an area which is near said high frequency speaker component, wherein said enclosure includes:

i) insulation secured against an interior surface of said rear wall, said side walls, said top wall and said bottom wall; and ii) a decorative grill secured against an exterior surface of said front wall.

4. An audio loudspeaker system as recited in claim 3, further including:

a) said front wall, said rear wall, said side walls, said top wall and said bottom wall of said enclosure fabricated out of plywood or particle board; and b) said insulation fabricated out of foam rubber or fiberglass batting.

* * * * *